United States Patent
Schmukler

(10) Patent No.: US 9,595,928 B2
(45) Date of Patent: Mar. 14, 2017

(54) BIAS CIRCUITS AND METHODS FOR DEPLETION MODE SEMICONDUCTOR DEVICES

(71) Applicant: CREE, INC., Durham, NC (US)

(72) Inventor: Bruce C. Schmukler, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/812,715

(22) Filed: Jul. 29, 2015

(65) Prior Publication Data

US 2017/0033749 A1    Feb. 2, 2017

(51) Int. Cl.
| | |
|---|---|
| H03F 3/04 | (2006.01) |
| H03F 3/193 | (2006.01) |
| H03F 1/02 | (2006.01) |
| H03F 3/21 | (2006.01) |
| H03F 3/45 | (2006.01) |

(52) U.S. Cl.
CPC ........... *H03F 3/193* (2013.01); *H03F 1/0205* (2013.01); *H03F 3/21* (2013.01); *H03F 3/45179* (2013.01); *H03F 2200/451* (2013.01); *H03F 2203/45154* (2013.01)

(58) Field of Classification Search
CPC .......... H03F 3/193; H03F 3/0205; H03F 3/21; H03F 3/45179; H03F 2200/451; H03F 2203/45154
USPC ............... 330/123, 130, 136, 138, 142, 296; 257/194, 205, 280, 348, 402; 326/13, 69, 326/116; 327/431
See application file for complete search history.

(56) References Cited

U.S. PATENT DOCUMENTS

| | | | |
|---|---|---|---|
| 4,059,811 A * | 11/1977 | Hoffman | H03F 1/34 330/277 |
| 4,320,352 A * | 3/1982 | Rubin | H03F 1/0261 330/277 |
| 5,079,456 A | 1/1992 | Kotowski et al. | |
| 5,387,880 A * | 2/1995 | Kobayashi | H03F 1/226 330/277 |
| 5,986,508 A * | 11/1999 | Nevin | H03F 1/301 330/289 |
| 6,046,642 A | 4/2000 | Brayton et al. | |
| 6,288,613 B1 * | 9/2001 | Bennett | H03F 1/306 330/277 |
| 6,433,386 B1 | 8/2002 | Yun et al. | |
| 6,529,077 B1 | 3/2003 | Dasgupta | |
| 6,714,081 B1 | 3/2004 | Xu | |

(Continued)

OTHER PUBLICATIONS

"Self Adjusting Bias Current Generator for IC Amplifier", IBM Technical Disclosure Bulletin, Dec. 1, 1980, vol. 23, Issue 7B, pp. 3330-3331.*

(Continued)

*Primary Examiner* — Steven J Mottola
*Assistant Examiner* — Hafizur Rahman
(74) *Attorney, Agent, or Firm* — Myers Bigel, P.A.

(57) ABSTRACT

A Radio Frequency (RF) amplifier includes a depletion mode semiconductor device having a gate, a bias device and an inverting circuit. The depletion mode semiconductor device may be a HEMT and/or a MESFET. The bias device is configured to generate a bias voltage. The inverting circuit is configured to generate an inverted bias voltage from the bias voltage, and to apply the inverted bias voltage to the gate. Related circuits and methods are described.

19 Claims, 15 Drawing Sheets

(56) References Cited

U.S. PATENT DOCUMENTS

| | | | |
|---|---|---|---|
| 6,774,724 B2 | 8/2004 | Krvavac | |
| 7,242,252 B2* | 7/2007 | Taylor | G05F 3/205 |
| | | | 330/285 |
| 7,304,539 B2* | 12/2007 | Tsurumaki | H03F 1/301 |
| | | | 330/285 |
| 7,799,646 B2 | 9/2010 | Su et al. | |

OTHER PUBLICATIONS

Ganesh, "Simulation of GaAs MESFET and HEMT Devices for RF Applications", International Journal of Emerging Trends and Technology in Computer Science (IJETTCS) vol. 2, Issue 1 Jan.-Feb. 2013, pp. 123-128.*

Bellantoni, "Bias Techniques for GaN and pHEMT Depletion Mode Devices", Eng. Rev. 3, © TriQuint, Jul. 24, 2014, 19 pp.

Cree, Inc., "GaN HEMT Biasing Circuit with Temperature Compensation", Application Note: APPNOTE-11 Rev. B, © 2012 Cree, Inc., 2 pp.

Cree, Inc., Data Sheet—"CMPA0060025D—25 W, 20 MHz—6.0 GHz, GaN MMIC, Power Amplifier" (Rev 1.2—Dec. 2014), 7 pp.

Cree, Inc., Data Sheet—"CMPA1D1E025F—25 W, 13.75—14.5 GHz, 40 V, Ku-Band GaN MMIC, Power Amplifier" (Rev 0.0—Mar. 2015)—Preliminary, 13 pp.

Cree, Inc., Data Sheet—"CMPA1D1E030D—30 W, 13.75—14.5 GHz, 40 V, GaN MMIC, Power Amplifier" (Rev 0.0—Apr. 2015)—Preliminary, 6 pp.

Cree, Inc., Data Sheet—"CMPA2560025D—25 W, 2.5—6.0 GHz, GaN MMIC, Power Amplifier" (Rev 1.3—Sep. 2012), 9 pp.

Cree, Inc., Data Sheet—"CMPA2735075D—75 W, 2.7—3.5 GHz, GaN MMIC, Power Amplifier" (Rev 1.1—Apr. 2012), 7 pp.

Cree, Inc., Data Sheet—"CMPA5585025F—25 W, 5.5—8.5 GHz, GaN MMIC, Power Amplifier" (Rev 3.2—Mar. 2015), 18 pp.

Cree, Inc., Data Sheet—"CMPA801B025D—25 W, 8.0—11.0 GHz, GaN MMIC, Power Amplifier" (Rev 1.0—Jun. 2014), 7 pp.

Cripps, "RF Power Amplifiers for Wireless Communications, Second Edition", Artech House Microwave Library (Hardcover), Norwood, MA, © 2006, pp. 350-357.

Duclercq et al., "RF LDMOS Power Modules for GSM Base Station Application: Optimum Biasing Circuit", Application Note—AN1643, Rev. 0, Jan. 1998, © Freescale Semiconductor, Inc., 1998, 2009, 3 pp.

Gola et al., "Quiescent Current Thermal Tracking Circuit in the RF Integrated Circuit Family", Application Note—AN1977, Rev. 0, Oct. 2003, © Freescale Semiconductor, Inc., 2003, 2009, 6 pp.

Pengelly et al., "A Review of GaN on SiC High Electron-Mobility Power Transistors and MMICs", *IEEE Transactions on Microwave Theory and Techniques*, vol. 60, No. 6, Jun. 2012, pp. 1764-1783.

Seto, "Quiescent Current Control for the RF Integrated Circuit Device Family", Application Note—AN1987, Rev. 1, May 2004, © Freescale Semiconductor, Inc., 2004, 2009, 8 pp.

Soares, "GaAs MESFET Circuit Design, Second Edition" (Hardcover), Artech House, Norwood, MA, © 1988, pp. 146-147.

* cited by examiner

BIAS CIRCUITS AND METHODS FOR DEPLETION MODE SEMICONDUCTOR DEVICES

FIELD

Various embodiments described herein relate to power semiconductor devices and, more particularly, to circuits and operating methods for power semiconductor devices.

BACKGROUND

Power semiconductor devices are widely used to carry large currents, support high voltages and/or operate at high frequencies such as radio frequencies. A wide variety of power semiconductor devices are known in the art including, for example, High Electron Mobility Transistors (HEMT) and Metal Semiconductor Field Effect Transistors (MESFETs). Modern power semiconductor devices are generally fabricated from wide bandgap semiconductor materials. For example, HEMTs may be fabricated from silicon or, more recently, from gallium nitride (GaN) material systems on a silicon carbide (SiC) substrate. The power device may be marketed as a discrete power device or may be integrated in a Monolithic Microwave Integrated Circuit (MMIC). An overview of GaN-on-SiC HEMTs and MMICs may be found in the invited paper entitled "*A Review of GaN on SiC High Electron-Mobility Power Transistors and MMICs*" by Pengelly et al., *IEEE Transactions on Microwave Theory and Techniques*, Vol. 60, No. 6, June 2012, pp. 1764-1783.

Field effect transistors may be classified into depletion mode and enhancement mode types, corresponding to whether the transistor is in an ON-state or an OFF-state at zero gate voltage. In enhancement mode devices, the devices are OFF at zero gate voltage, whereas in depletion mode devices, the device is ON at zero gate voltage. HEMTs and MESFETs are typically depletion mode devices, in that they are conductive at zero gate bias due to the polarization-induced charge at a barrier/channel interface. Examples of such depletion mode devices include gallium arsenide (GaAs) MESFETs, GaAs pHEMTs and GaN HEMTs. Depletion mode GaN HEMTs that are marketed by Cree, Inc. are described in the following data sheets: "CMPA2735075D-75 W, 2.7-3.5 GHz, GaN MMIC, Power Amplifier" (Rev 1.1—April 2012); "CMPA0060025D-25 W, 20 MHz-6.0 GHz, GaN MMIC, Power Amplifier" (Rev 1.2—December 2014); "CMPA1D1E025F-25 W, 13.75-14.5 GHz, 40 V, Ku-Band GaN MMIC, Power Amplifier" (Rev 0.0—March 2015); "CMPA801B025D-25 W, 8.0-11.0 GHz, GaN MMIC, Power Amplifier" (Rev 1.0—June 2014); "CMPA2560025D-25 W, 2.5-6.0 GHz, GaN MMIC, Power Amplifier" (Rev 1.3—September 2012); "CMPA1D1E030D-30 W, 13.75-14.5 GHz, 40 V, GaN MMIC, Power Amplifier" (Rev 0.0—April 2015); and "CMPA5585025F-25 W, 5.5-8.5 GHz, GaN MMIC, Power Amplifier" (Rev 3.2—March 2015). Other depletion mode power devices may also be provided, such as depletion mode power Metal Oxide Semiconductor Field Effect Transistors (MOSFETs) or Junction Field Effect Transistors (JFETs).

SUMMARY

Various embodiments described herein can provide a Radio Frequency (RF) amplifier that comprises a depletion mode semiconductor device including a gate, a bias device and an inverting circuit. In some embodiments, the depletion mode semiconductor device may comprise a HEMT and/or a MESFET. The bias device is configured to generate a bias voltage. In some embodiments, the bias device is configured to mirror a current in the depletion mode semiconductor device and to provide the bias voltage based on the current that is mirrored. The inverting circuit is configured to generate an inverted bias voltage from the bias voltage, and to apply the inverted bias voltage to the gate. An input terminal may also be provided that is connected to the gate.

In some embodiments, the depletion mode semiconductor device is a first depletion mode semiconductor device and the bias device comprises a second depletion mode semiconductor device. Moreover, in some embodiments, the first and second depletion mode semiconductor devices are configured to have substantially the same electrical and thermal characteristics. In other embodiments, the first and second depletion mode semiconductor devices may have substantially the same threshold voltage. In still other embodiments, the gate is a first gate and the second depletion mode device includes a second gate that is connected to a reference voltage.

Other embodiments may include a current setting circuit that is connected to the second depletion mode semiconductor device. The current setting circuit may comprise a resistor, a current sink, a resistor ladder Digital-to-Analog Conveiter (DAC) and/or other current sourcing/sinking device.

In some embodiments, the inverting circuit comprises a differential amplifier having an inverting input that is connected to the bias device and an output that is connected to the gate. The differential amplifier may be a unity gain inverting differential amplifier.

In some embodiments, the RF amplifier further comprises a third depletion mode semiconductor device including a third gate. The inverted bias voltage is also applied to the third gate.

An RF amplifier according to other embodiments described herein comprises first and second depletion mode semiconductor devices and an inverting circuit. The first depletion mode semiconductor device includes a first gate. The second depletion mode semiconductor device includes a second gate that is connected to a reference voltage such as ground. The inverting circuit is connected between the second depletion mode device and the first gate.

In some embodiments, the first and second depletion mode semiconductor devices are included in a common semiconductor die. In other embodiments, the second depletion mode device includes a source and a drain, and the RF amplifier further includes a current setting circuit that is connected to the source. The current setting circuit may be embodied as a resistor, a current sink, a resistor ladder DAC and/or other current sourcing/sinking device.

In some embodiments, the inverting circuit comprises a differential amplifier having an inverting input that is connected between the source and the current setting circuit, and an output that is connected to the first gate.

Other embodiments may also include a resistor that connects the second gate to the reference voltage. Yet other embodiments may further comprise a third depletion mode semiconductor device including a third gate, wherein the inverting circuit is also connected to the third gate.

An RF amplifier that comprises a depletion mode semiconductor device including a gate may be operated according to various embodiments described herein, by applying an inverted bias voltage to the gate. The inverted bias voltage may be applied to the gate by generating a mirrored current of the depletion mode semiconductor device and a bias voltage for the depletion mode semiconductor device corresponding to the mirrored current, and inverting the bias voltage to generate the inverted bias voltage.

BRIEF DESCRIPTION OF THE DRAWINGS

The accompanying drawings, which are included to provide a further understanding and are incorporated in and constitute a part of this application, illustrate certain embodiment(s) described herein. In the drawings.

DETAILED DESCRIPTION

The threshold voltage of depletion mode GaN HEMTs and other depletion mode power devices may vary dramatically as a result of process variations during the manufacture thereof and/or other factors such as temperature. This wide variation may cause bias current variation when using a constant gate voltage bias. Unfortunately, however, many modern communications systems use digital modulations that require linear amplification. A depletion mode HEMT may have the best linearity when biased just above the threshold voltage. A bias current that is too high or too low can result in dramatically reduced linearity.

This wide variation in bias current may be compensated for by individually tuning the gate voltage for each depletion mode semiconductor device to keep the bias in the range for best linearity. Alternatively, devices that are produced may be individually tested and then binned or sorted to group devices that have similar bias current for a given gate voltage bias. Unfortunately, these tuning or binning techniques may be costly and may not be amenable to high volume production.

Various embodiments described herein can provide an RF amplifier that can reduce the variation in bias current as a function of gate bias voltage for the device, by providing a bias device, also referred to herein as a "self-bias device". The bias device is configured to generate a bias voltage for the depletion mode semiconductor device, and an inverting circuit that is configured to generate an inverted bias voltage from the bias voltage and to apply the inverted bias voltage to the gate. The bias device may be a second depletion mode semiconductor device that has substantially the same electrical and thermal characteristics, such as substantially the same threshold voltage, as the depletion mode semiconductor device. The bias device may be configured to mirror a current in the depletion mode semiconductor device, and to provide a bias voltage for the depletion mode semiconductor device based on the current that is mirrored. Stated differently, a "negative current mirror" may be provided to provide a gate bias voltage for the depletion mode semiconductor device that provides a predetermined constant current in the depletion mode semiconductor device that is relatively independent of process variations and/or temperature, by varying the gate voltage applied to the depletion mode semiconductor device to keep the current constant.

Figure 1:
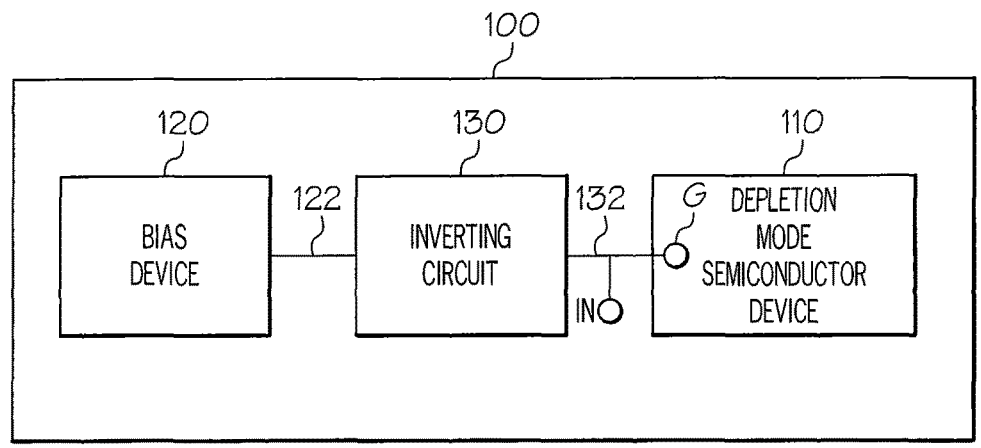
FIGS. 1-7 are block diagrams of a Radio Frequency (RF) amplifier according to various embodiments described herein.

FIG. 1 is a block diagram of an RF amplifier according to various embodiments described herein. As illustrated in FIG. 1, the RF amplifier 100 includes a depletion mode semiconductor device 110 that includes gate G. A bias device 120 is configured to generate a bias voltage 122. An inverting circuit 130 is configured to generate an inverted bias voltage 132 from the bias voltage 122 and to apply the inverted bias voltage 132 to the gate G. An RF input terminal IN is also provided at the gate G of the depletion mode semiconductor device 110.

Figure 2:
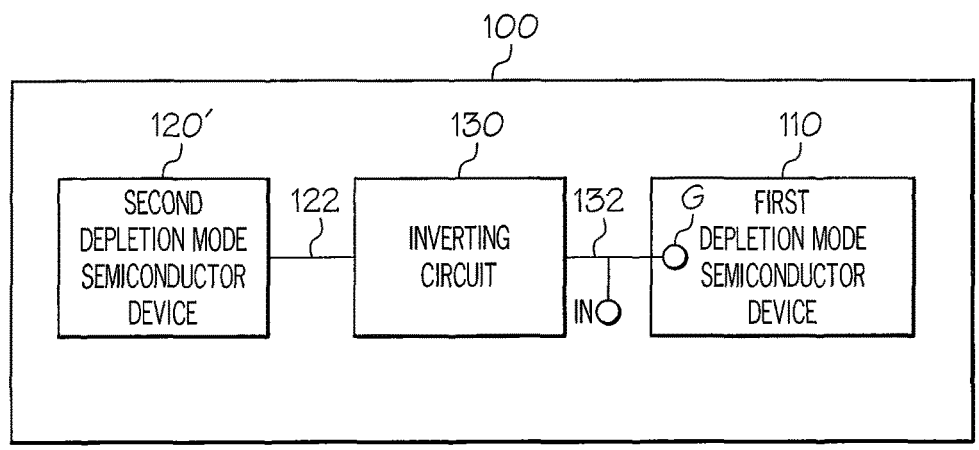

FIG. 2 is a block diagram of other embodiments. In these embodiments, the depletion mode semiconductor device 110 is a first depletion mode semiconductor device, and the bias device 120' comprises a second depletion mode semiconductor device.

Figure 3:
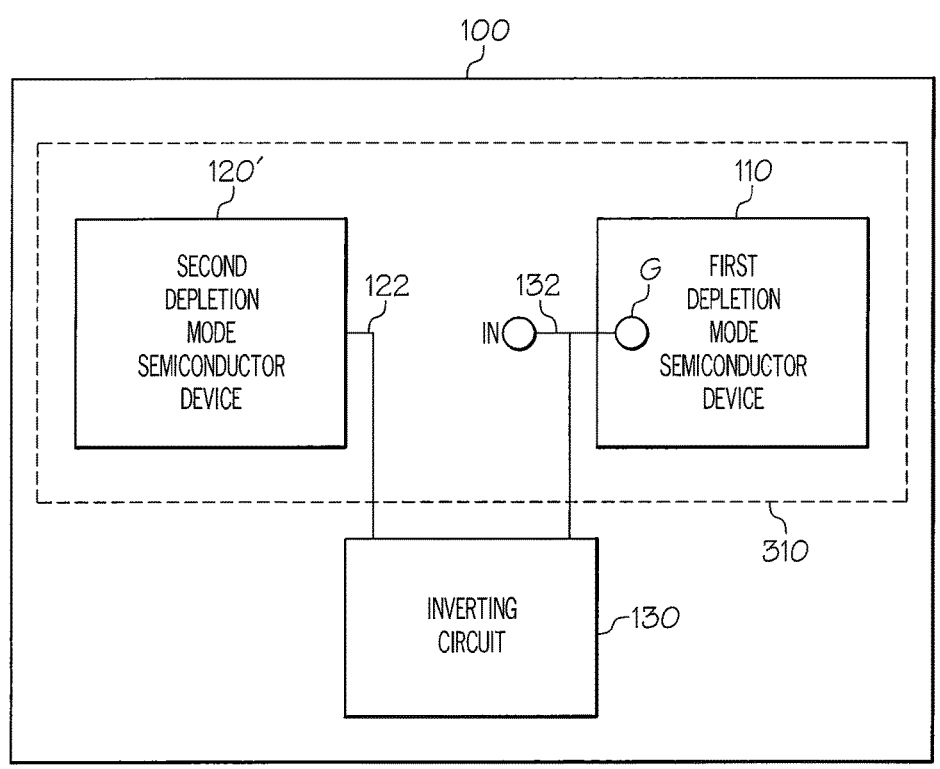

Moreover, as illustrated in FIG. 3, the first depletion mode semiconductor device 110 and the second depletion mode semiconductor device 120' may be configured to have substantially the same electrical characteristics, such as the same threshold voltage and/or substantially the same thermal characteristics. As used herein, "substantially the same" electrical characteristics and/or thermal characteristics means that these characteristics deviate by less than about 5%. However, in some embodiments, these characteristics may deviate by less than about 2% or even less than about 1%. As illustrated in FIG. 3, substantially the same electrical and thermal characteristics may be obtained by including the first depletion mode semiconductor device 110 and the second depletion mode semiconductor device 120' in a common semiconductor die 310. More specifically, these devices may be fabricated together on a wafer, and in some embodiments in adjacent locations on a wafer, so that process variations between the first and second depletion mode semiconductor devices 110 and 120', respectively, are reduced or minimal. The inverting circuit 130 may also be fabricated in the same wafer and included in the common semiconductor die 310, in some embodiments. In other embodiments, the inverting circuit may be fabricated using standard Complementary Metal Oxide Semiconductor (CMOS) fabrication techniques, and then packaged together with the common semiconductor die 310 to provide a packaged RF amplifier 100.

Figure 4:
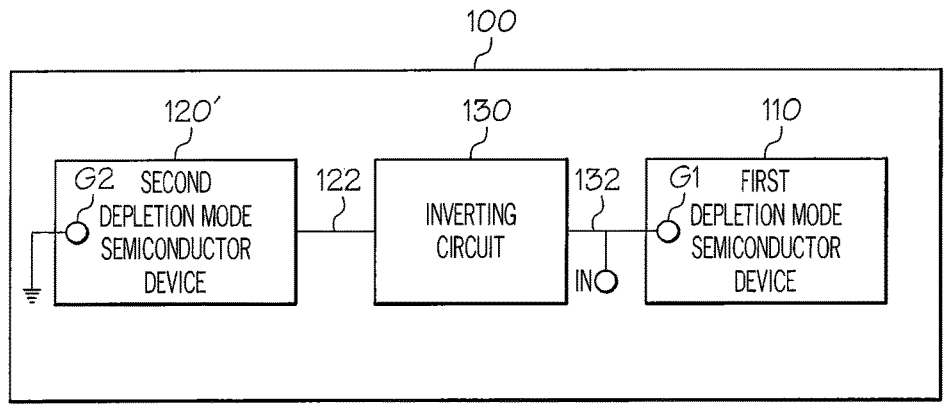

FIG. 4 illustrates other embodiments, where the gate of the first depletion mode semiconductor device 110 is a first gate G1 and the second depletion mode semiconductor device 120' includes a second gate G2 that is connected to a reference voltage, illustrated in FIG. 2 as ground voltage.

Figure 5:
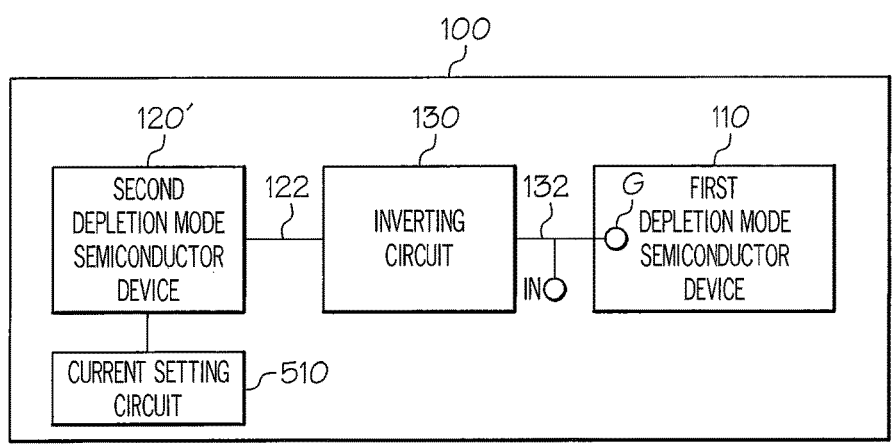

FIG. 5 illustrates other embodiments, wherein the RF amplifier 100 further includes a current setting circuit 510 that is connected to the second depletion mode semiconductor device 120'. The current setting circuit 510 may be embodied by a resistor, a resistor ladder network DAC and/or any other current setting circuit. When embodied using a resistor ladder network DAC, the current through the second depletion mode semiconductor device 120' may be programmable.

Figure 6:
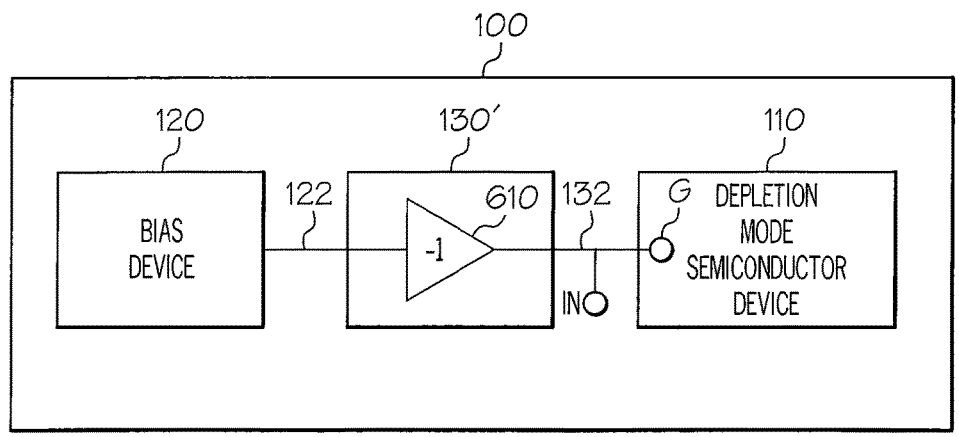

FIG. 6 illustrates other embodiments, wherein the inverting circuit 130' comprises a differential amplifier 610, such as an operational amplifier, having an inverting input, indicated by a "−" sign in Block 610, that is connected to the bias device 120 and an output that is connected to the gate G of the depletion mode semiconductor device 110. As illustrated in FIG. 6, in some embodiments, the differential amplifier 610 may be a unity gain inverting differential amplifier (gain=−1). In other embodiments, the gain may be different than unity, for example to compensate for second order effects, such as minor deviations in the electrical and/or thermal characteristics between the first and second depletion mode semiconductor devices, or even variations in the bias device current as a result of process variation.

Figure 7:
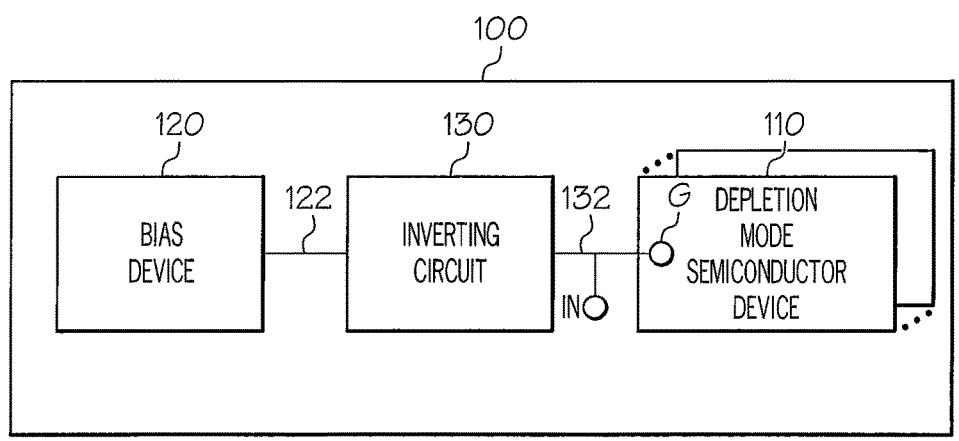

FIG. 7 illustrates other embodiments, wherein a plurality of depletion mode semiconductor devices 110 are provided. The inverted bias voltage 132 may be applied to one, all, or a subset of less than all of the depletion mode semiconductor devices 110, depending on the desired operation of the RF amplifier.

It will also be understood that any and all of the embodiments of FIGS. 1-7 may be combined in various combinations and subcombinations according to a specific design for an RF amplifier.

Figure 8:
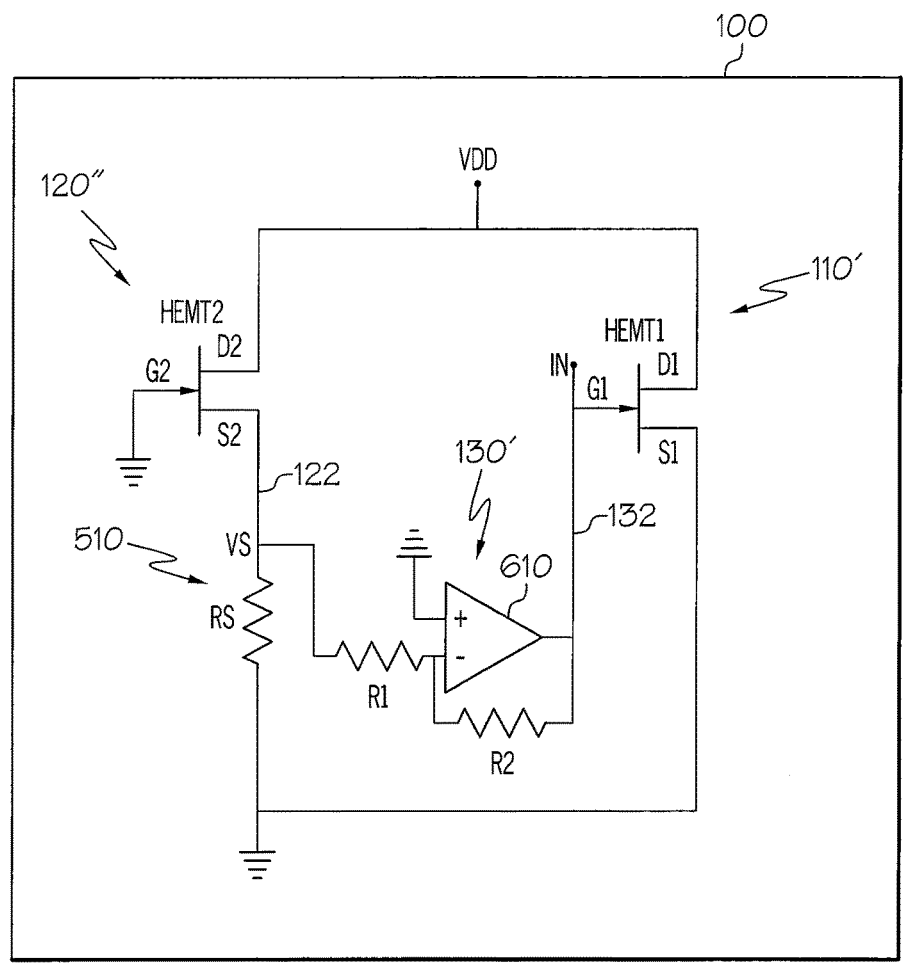
FIGS. 8-14 are circuit diagrams of an RF amplifier according to various embodiments described herein.

FIG. 8 is a circuit diagram of an RF amplifier according to various embodiments described herein. In these embodiments, the depletion mode semiconductor device 110 is embodied by a first depletion mode HEMT 110', denoted HEMT1, having a first gate G1, a first drain D1 and a first source S1. The bias device 120 is embodied by a second depletion mode HEMT 120", denoted HEMT2, having a second gate G2, a second drain D2 and a second source S2. The second gate G2 is connected to a reference voltage, such as ground voltage. The inverting circuit 130' may be embodied by a differential amplifier 610, such as an operational amplifier, having an inverting input (denoted by a "−" sign in Block 610) that is connected between the source S2 of HEMT2 and a current setting circuit 510, a non-inverting input (denoted by a "+" sign in Block 610) that is connected to a reference voltage, such as ground, and an output that is connected to the first gate G1. The action of the inverting amplifier 610 makes the voltage on G1 less than the voltage on S1, which is ground in FIG. 8. The current setting circuit 510 may be in the form of a source resistor RS. First and second resistors R1 and R2 may also be provided to set the amplification factor of the differential amplifier 610. In some embodiments, R1=R2, to provide a unity gain inverting differential amplifier 610. In FIG. 8, all of the circuit elements may be included in a single MMIC.

Figure 9:
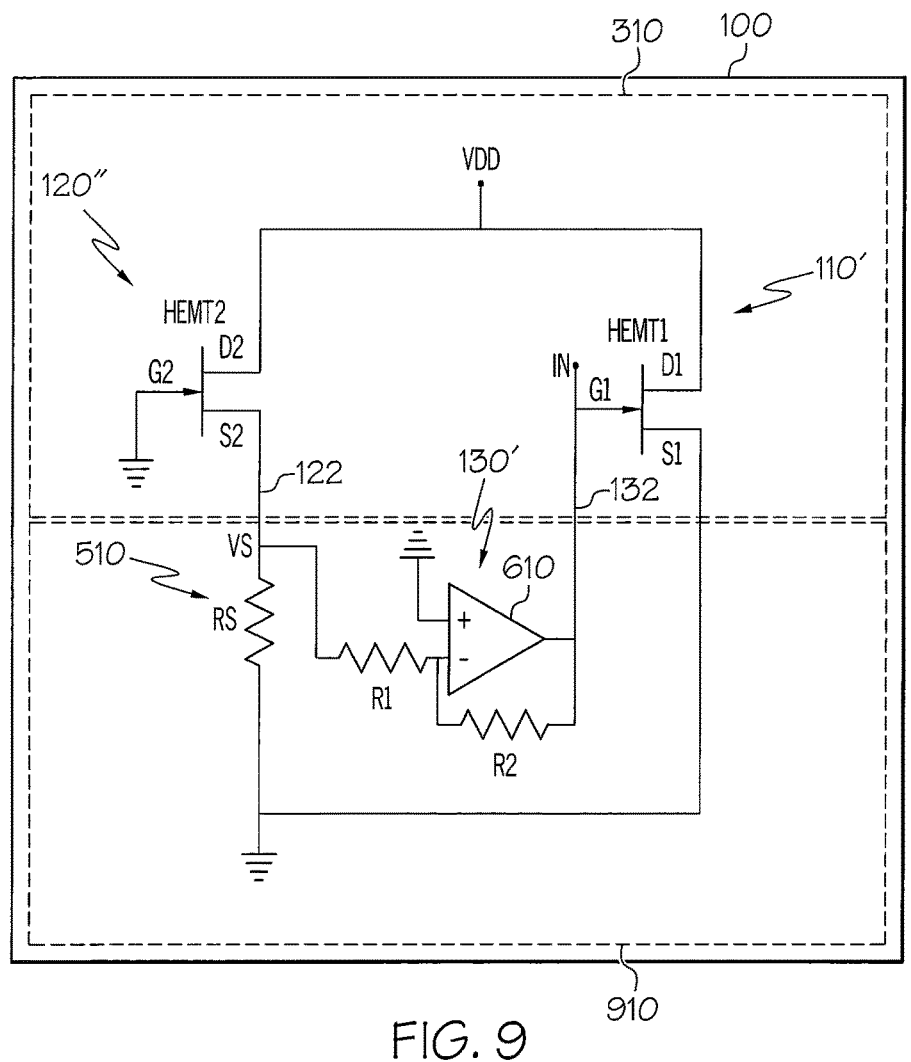

FIG. 9 illustrates other embodiments, wherein HEMT1 and HEMT2 are included in a common semiconductor die, such as a GaN-on-SiC die, whereas the current setting resistor RS, the differential amplifier 610 and its resistors, R1 and R2 are included in a CMOS integrated circuit 910, which is packaged with the common semiconductor die 310. It will be understood, however, that in other embodiments, the resistors RS, R1 and/or R2 may be included in the power semiconductor die 310.

For example, the resistor RS can be either on the GaN chip 310 or off the GaN chip 310 on another chip 910 as illustrated in FIG. 9, or as a discrete device off-chip. Placing the resistor RS off-chip can allow the user to control the desired current by changing the value of RS. It is also possible to make the value of RS digitally controllable, to allow software control of the current, as will be illustrated in FIG. 11. The resistors R1, R2 and the inverting amplifier 610 can also be on the GaN chip 310, or off the GaN chip as illustrated in FIG. 9. The off-chip components of the bias circuit can be integrated into a CMOS integrated circuit that is placed in the same package as the GaN device, making the product look like a single integrated device that can offer more functionality than presently available GaN devices.

Figure 10:
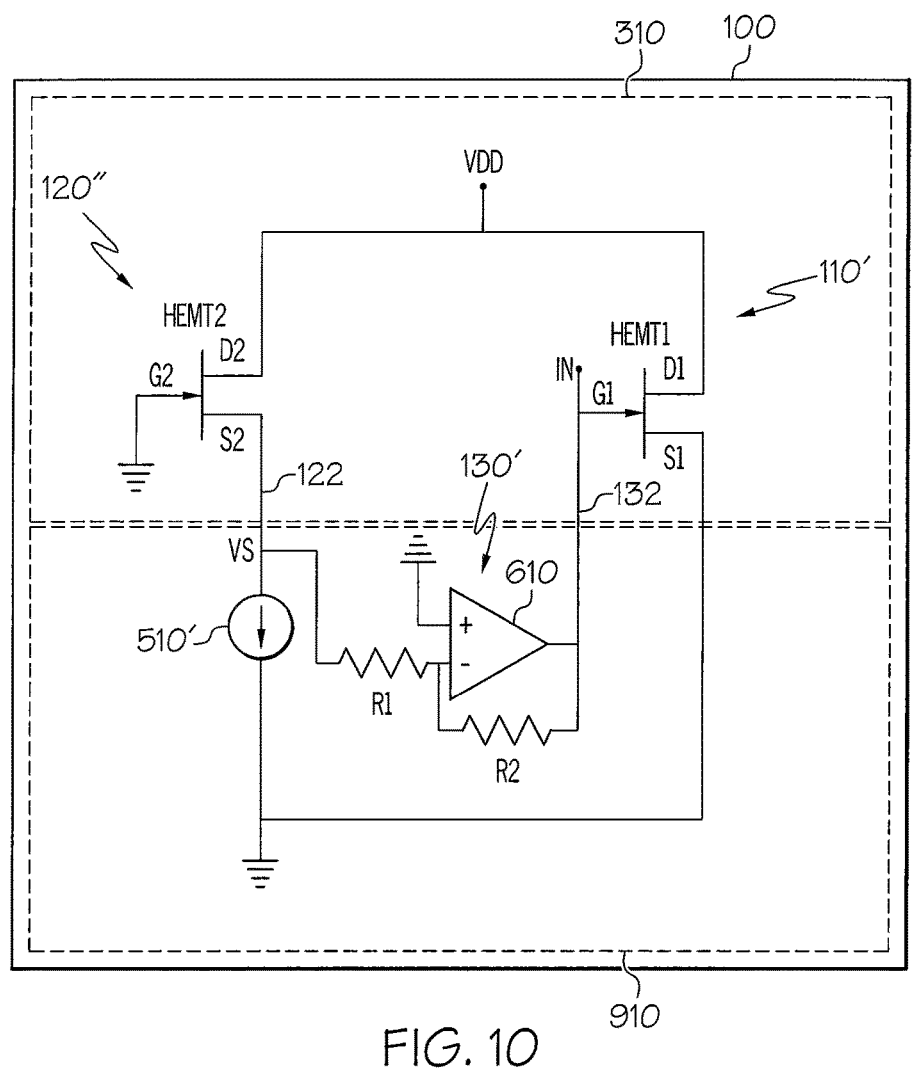

FIG. 10 illustrates other embodiments, wherein a current setting circuit 510 is embodied by a current sink 510'. The current sink 510' may be embodied by a pair of FETs, the gates of which are coupled together, the drains of which are coupled to a reference voltage such as ground, and the source of one FET is coupled to the gate thereof. Many other embodiments may be provided. A current sink may also be referred to as a "current source".

Figure 11:
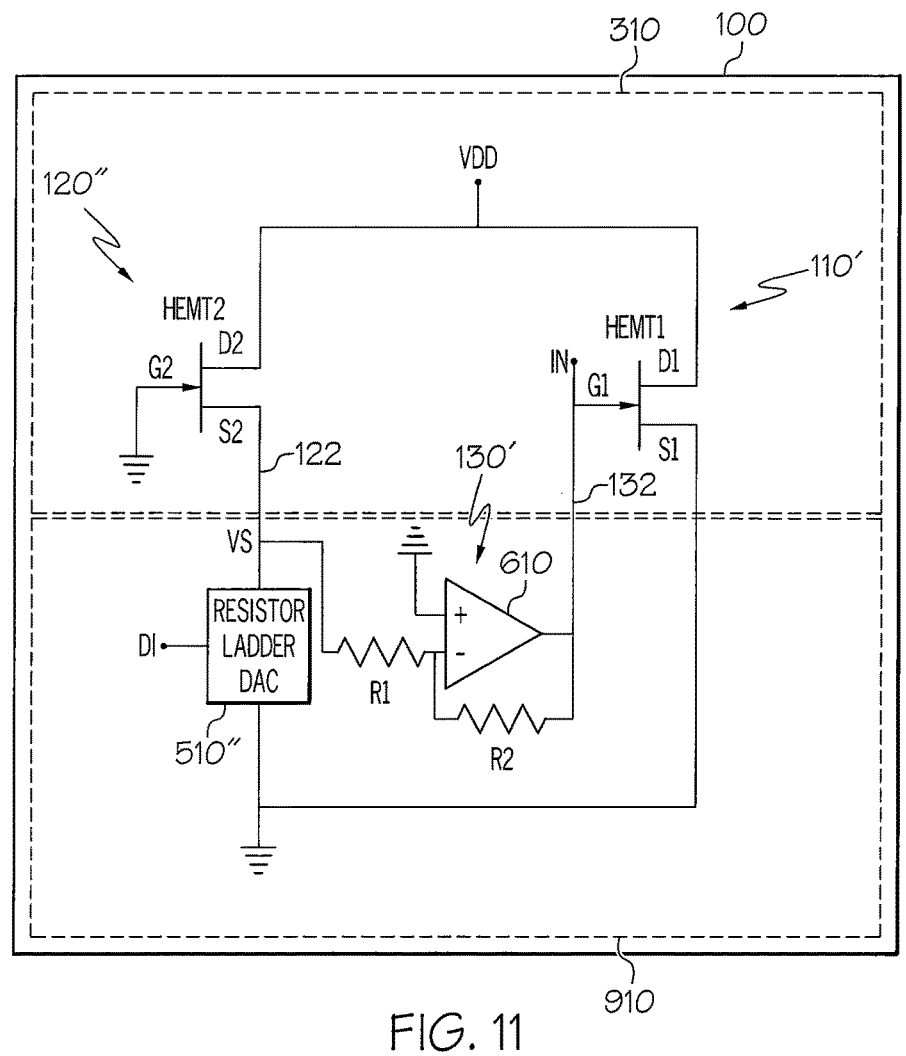

FIG. 11 illustrates yet other embodiments, wherein the current setting circuit 510 is embodied by a DAC such as a resistor ladder DAC 510". The resistor ladder DAC 510" may include a digital input DI that can be used to set the current level in HEMT2. For example, the DAC 510" may multiply a reference current by powers of two of each bit position by a multi-bit digital input DI. By embodying the current sink 510 as part of a programmable DAC 510", software adjustment of the current may be provided using the digital input DI. This current sink may be on-chip, off-chip or in a CMOS control chip that is placed in the same package as HEMT1 and HEMT2.

Figure 12:
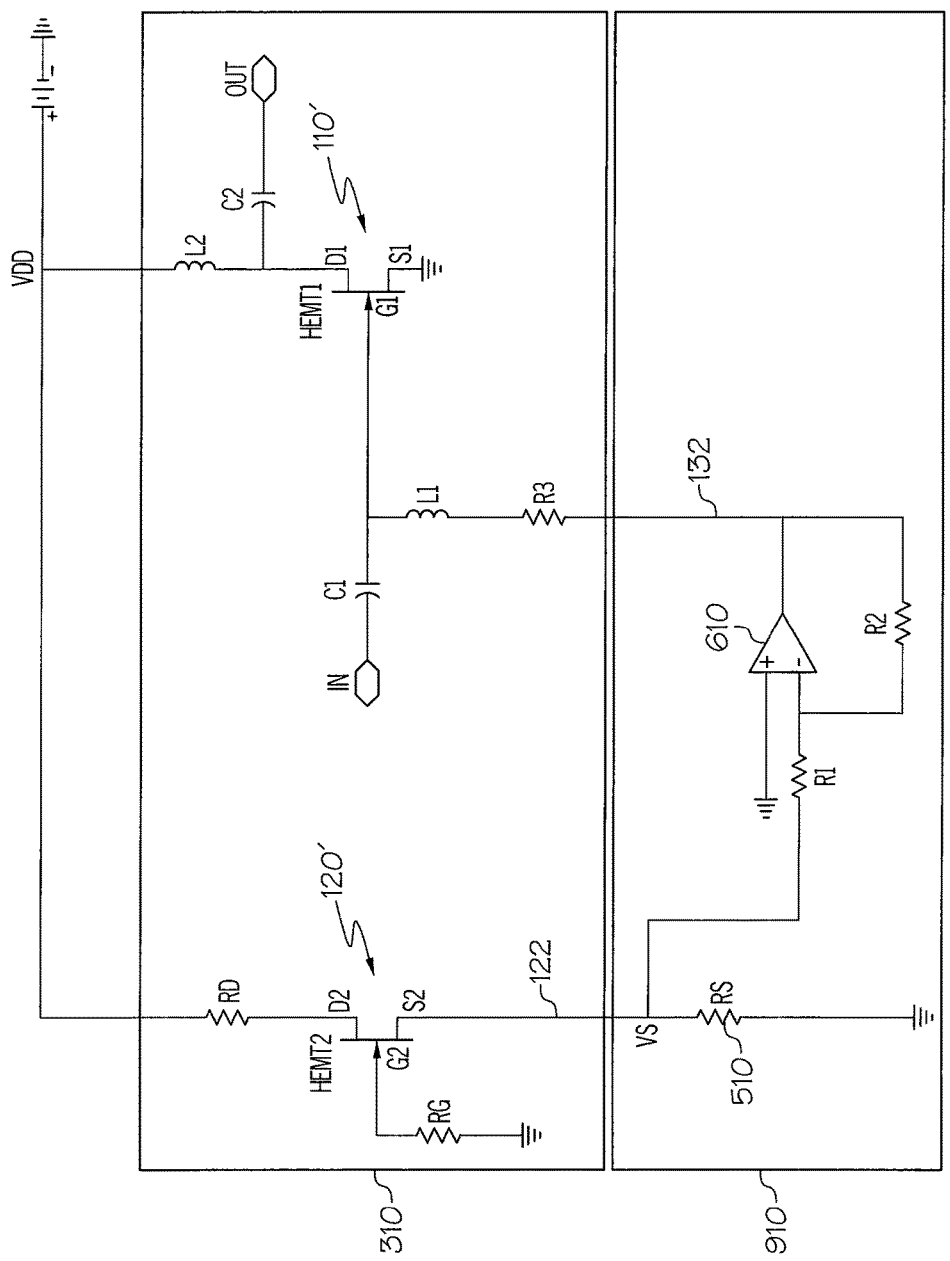

FIG. 12 is a more detailed circuit embodiment of FIG. 9, which includes a representation of the power supply voltage VDD and also illustrates an RF output OUT. Blocking capacitors C1 and C2 for the RF input IN and the RF output OUT are also illustrated. A gate resistor RG and a drain resistor RD for HEMT2 are also illustrated. These resistors can reduce or prevent oscillation of HEMT2. L1 and R3 represent gate chokes for the first gate G1. The gate chokes can be all inductive, all resistive or a combination of inductance and resistance, as is typically found and as is illustrated. An output choke L2 is also illustrated. In FIG. 12, resistors RG, RD and R3, capacitors C1 and C2 and inductors L1 and L2 are all illustrated as being embodied in the same semiconductor die 310, for example a GaN-on-SiC die. However, in other embodiments, any or all of these components may be moved to a separate CMOS die 910, or may be implemented as discrete devices. Moreover, any or all of the components of the CMOS die 910 may be moved onto the GaN-on-SiC die 310.

Figure 13:
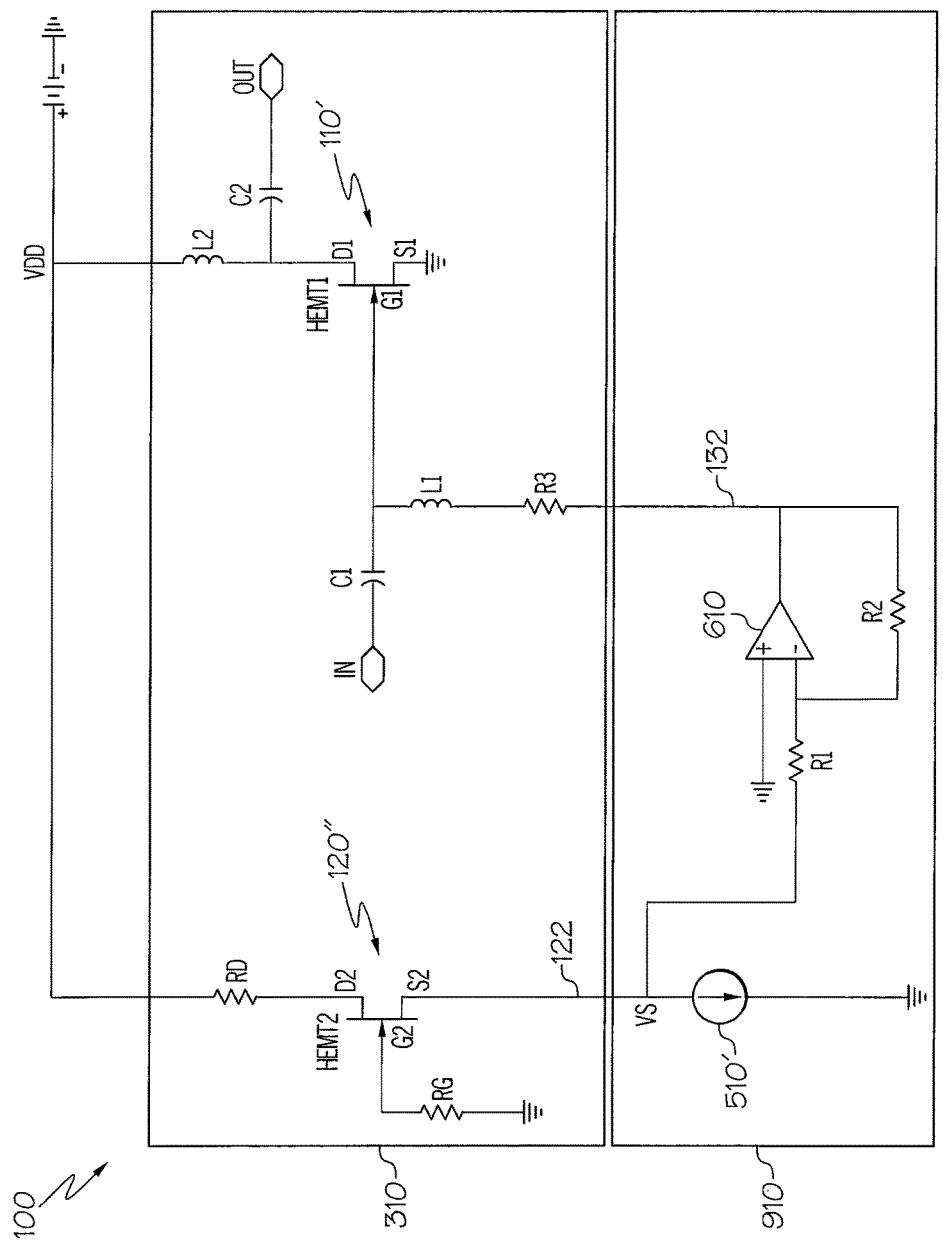

FIG. 13 is a detailed circuit diagram corresponding to FIG. 10. The same considerations described in connection with FIG. 12 apply to FIG. 13.

Figure 14:
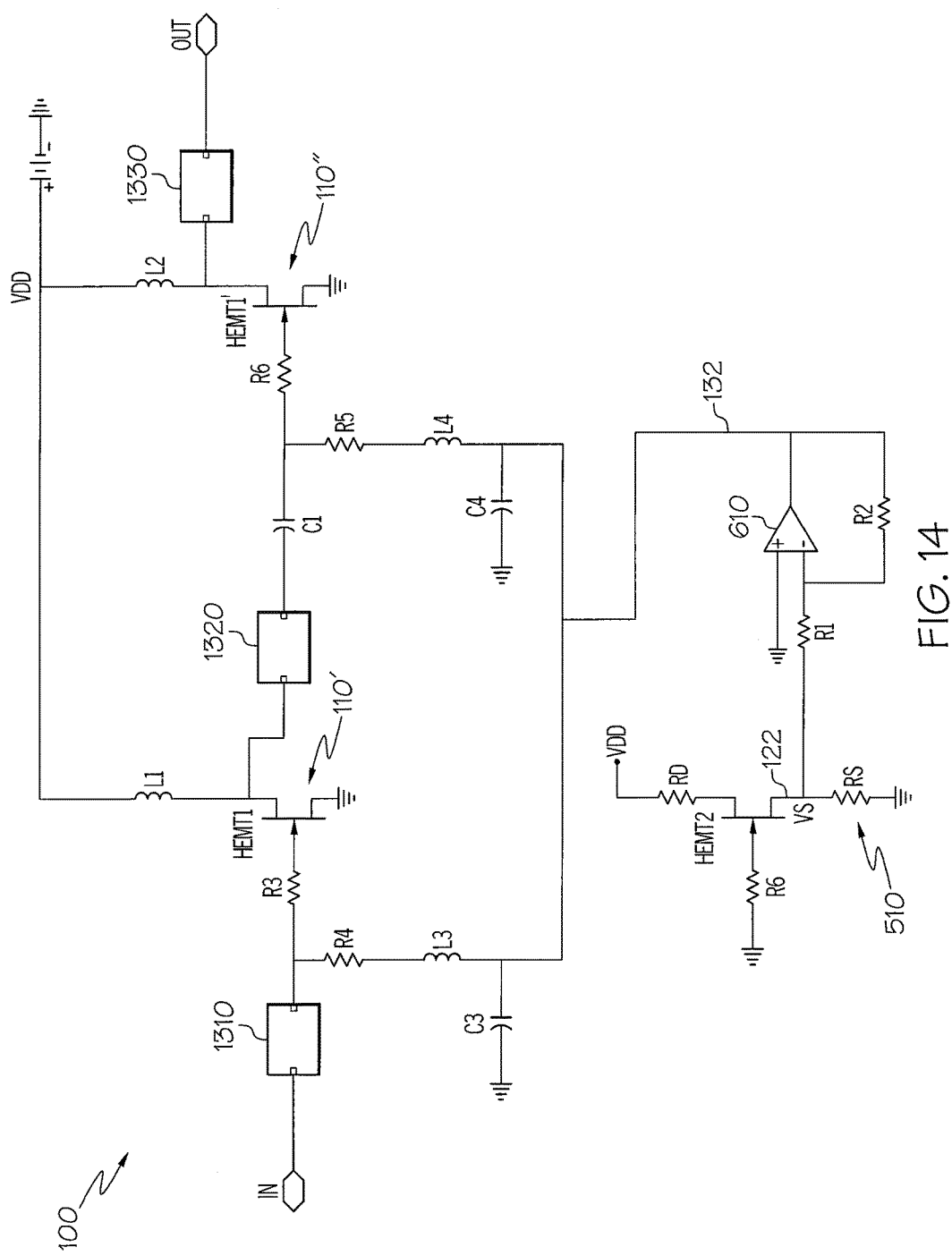

FIG. 14 is a detailed circuit diagram corresponding to an embodiment of FIG. 7. As shown in FIG. 14, a multi-stage RF amplifier 100 is shown with two stages HEMT1 and HEMT1' of amplification. HEMT1, HEMT1' and HEMT2 should all be the same type of depletion mode device and should all have similar device properties. As was described above, one way to provide this is to fabricate all three devices on the same wafer in close proximity. HEMT1' also includes inductor L4 and resistor R5, which represent the gate choke thereof. Output chokes L1 and L2 are included. Rather than blocking capacitors, an input match circuit 1310, an interstage match circuit 1320 and an output match circuit 1330 are provided. The same considerations described in connection with FIG. 12 apply to FIG. 14.

The match circuits 1310, 1320 and 1330 may be included to perform impedance transformation using passive components. The match circuits may also be part of the bias networks. There are many ways to implement the match circuits. The topologies may depend on a variety of factors including frequency, bandwidth, device characteristics, device sizes, impedance and/or desired performance parameters. For example, an input match circuit 1310 may be embodied by a single inductor or two series connected capacitors with a grounded inductor between them. The interstage match circuit 1320 may be embodied by an inductor with a grounded capacitor at one end and a second inductor and capacitor serially connected between the other end and ground. More complex resistor capacitor inductor interstage match circuits 1320 may also be provided. The output match circuit 1330 may be embodied by an inductor serially connected between the stages and a capacitor at either end of the inductor that is connected to ground. More complex networks of inductors and capacitors may also be provided.

It will also be understood that FIG. 14 shows two RF stages HEMT1 and HEMT1' connected to the same gate bias generator HEMT2. Three or more RF stages may also be connected to the same gate bias generator HEMT2. In other embodiments, one but less than all of the RF stages may be connected to the same gate bias generator HEMT2. Stated differently, only a subset of the RF stages may need to be connected to the gate bias generator HEMT2.

It will also be understood that any of the circuit embodiments of FIGS. 8-14 may be combined in various combinations and subcombinations, and may be also be combined with any of the block diagram embodiments of FIGS. 1-7 in various combinations and subcombinations.

Additional discussion of various embodiments described herein will now be provided.

Figure 15:
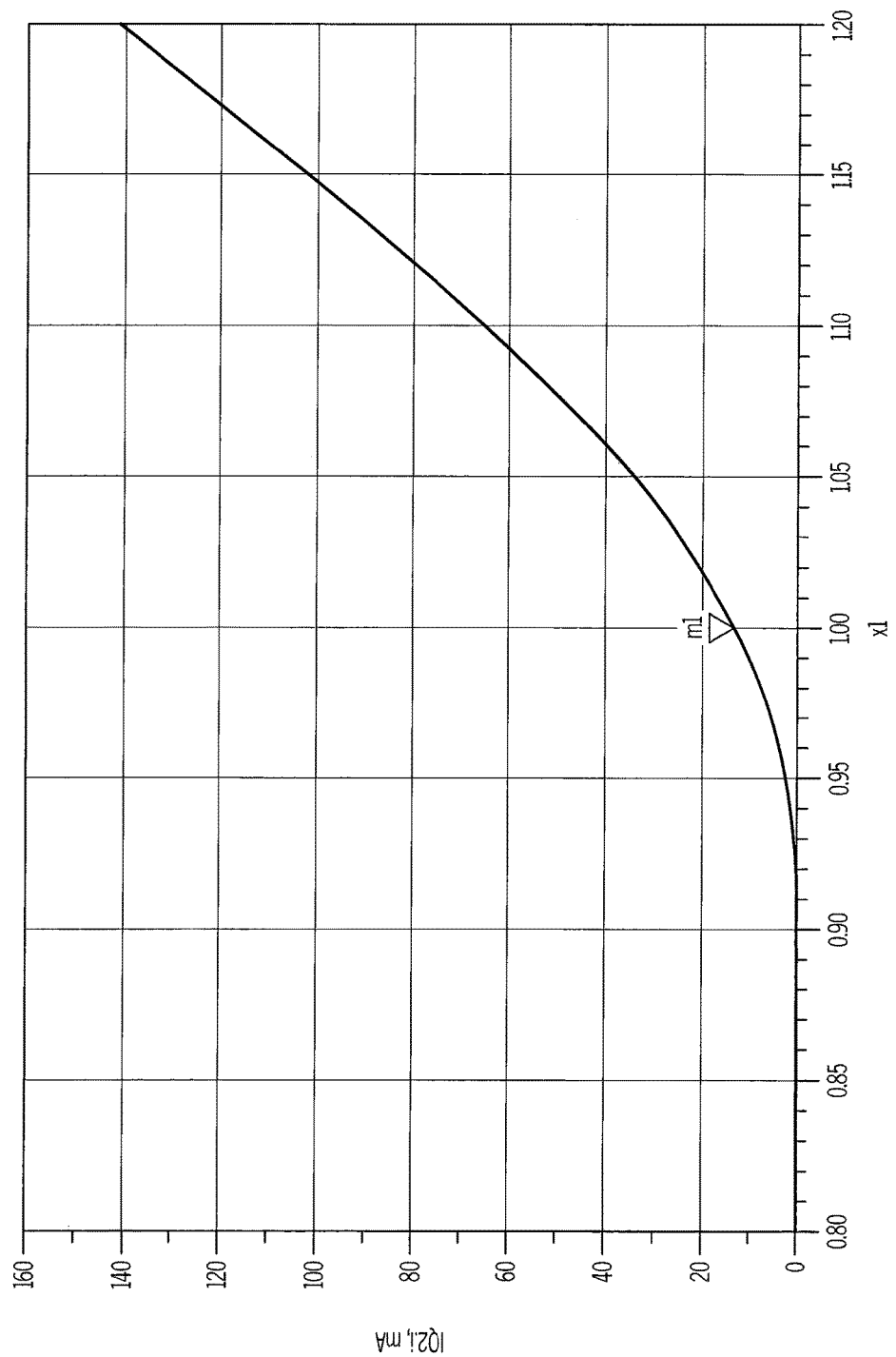
FIG. 15 graphically illustrates simulated current variation as a function of threshold voltage for a conventional RF amplifier.

As was described above, the threshold voltage of a GaN HEMT may vary considerably as a function of variations of process parameters and/or other factors, which causes bias current variation when using constant gate voltage bias. For example, FIG. 15 graphically illustrates the effect of threshold voltage on bias current of a simulated depletion mode HEMT for a constant gate voltage bias. The horizontal parameter x1 corresponds to threshold voltage variation as a percentage, and the vertical axis IQ2 represents the current through the depletion mode semiconductor device. The desired current is 13 mA, and is indicated by marker m1 in FIG. 15. As shown in FIG. 15, a threshold voltage variation of +/−20% can cause the current to vary from 0 to about 140 mA for a constant gate voltage of the depletion mode semiconductor device. Under these conditions, the linearity may only be acceptable for a small range, about x1=1.

In sharp contrast, various embodiments described herein can provide a bias device, also referred to a "self-bias device", 120, 120', 120", that in some embodiments has a grounded gate, and that in some embodiments is provided on the same GaN die as the depletion mode semiconductor device 110, 110', 110". An inverting circuit 130, 130', may be provided that includes an inverting differential amplifier 610 and various resistors denoted RS, R1 and R2. The threshold voltage of HEMTs on the same die should be the same or substantially the same (i.e., within about 5% of one another, and in some embodiments within about 2% or about 1% of one another). The bias device 120, 120', 120" creates a bias voltage 122 at the node VS that is approximately the inverse of the desired gate voltage for the depletion mode semiconductor device 110, 110'. The inverting amplifier 610 inverts the bias voltage 122 on node VS, and applies the inverted bias voltage 132 to the gate G of the depletion mode semiconductor device 110, 110'. Resistor RS can be used to adjust the overall current.

Resistors R1 and R2 can be used to adjust the gain of the inverting amplifier 610. The ratio of R2 and R1 may be approximately unity. The ratio can be adjusted, in some embodiments, to have a deviation of about 5% from unity to compensate for secondary effects. For example, the current in the bias device 120 may also have some variation. Adjusting the gain of the inverting circuit 130 and/or the source resistor RS can lead to a current variation in the depletion mode semiconductor device 110 that is less than the current variation of the bias device 120. Moreover, drain-to-source voltage may also impact current. In some embodiments, the depletion mode semiconductor device 110 and the bias device 120 may have similar drain-to-source voltages, but they may not be exactly the same. In another example, the current should scale with device size, but it may not always scale exactly with device size. As a final example, variations in the thermal resistance can impact the current. As described above, the ratio of resistors R1 and R2 can be used to adjust the gain of the inverting amplifier 610 to compensate for any of the above and/or other secondary effects.

Figure 16A:
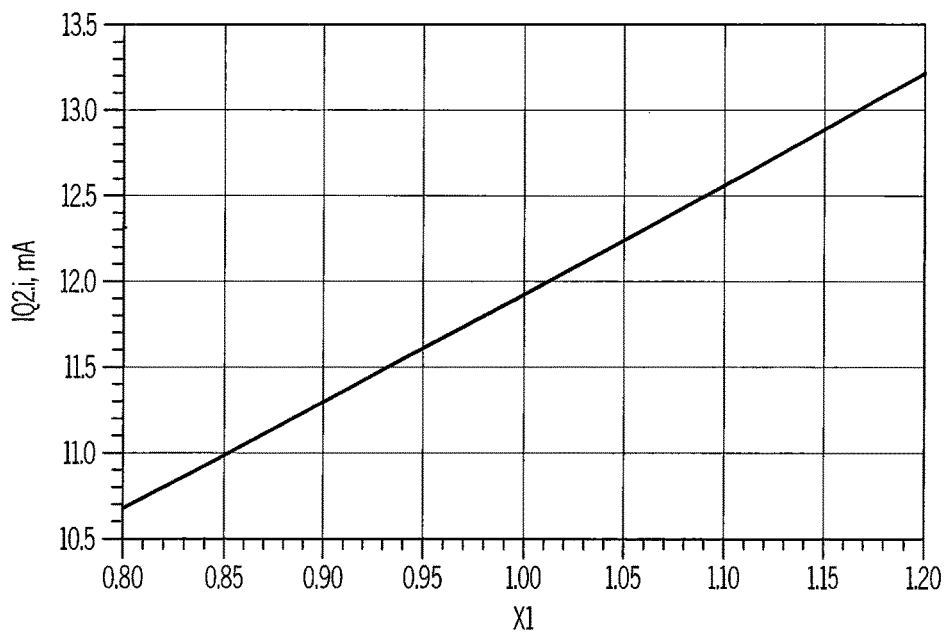
FIGS. 16A and 16B graphically illustrate simulated current and gate voltage for an RF amplifier according to various embodiments described herein.
Figure 16B:
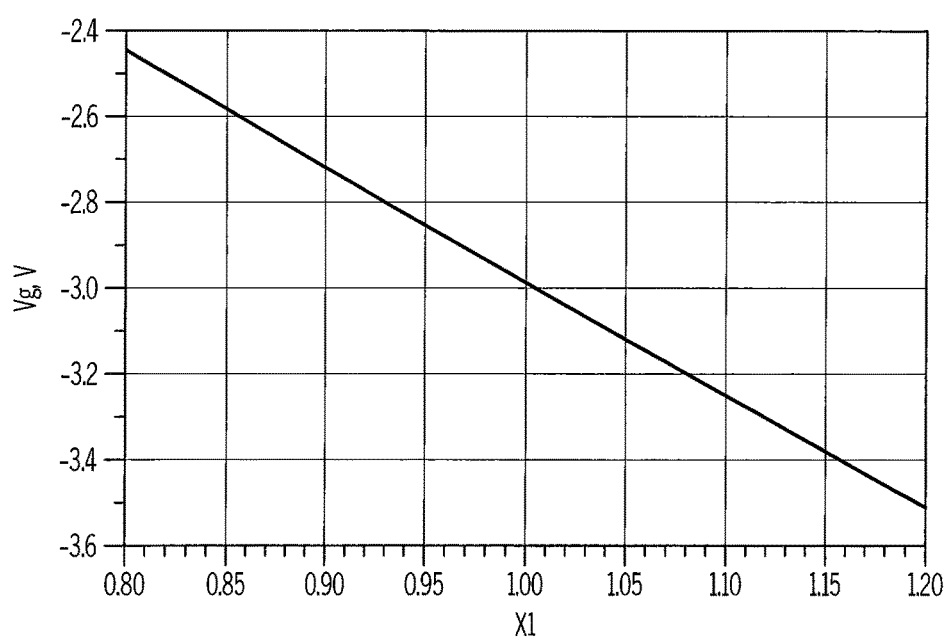

FIGS. 16A and 16B graphically illustrate simulation results for a circuit of FIG. 8, using the same HEMT for HEMT1 and HEMT2 of FIG. 8 as was used for the graph of FIG. 15. FIG. 16A shows the current in HEMT1 as a function of the threshold voltage parameter x1. Note the different scale of the y axis of FIG. 16A compared to the y axis of FIG. 15. In FIG. 16A, as the threshold voltage changes by +/−20%, the current only changes by +/−1.5 mA. This is a very large decrease over FIG. 15, where the current varied from 0 to 140 mA. FIG. 16B illustrates the gate voltage (i.e., the inverted bias voltage 132) applied to the gate G1 of HEMT1 as a function of the threshold voltage parameter x1.

Figure 17:
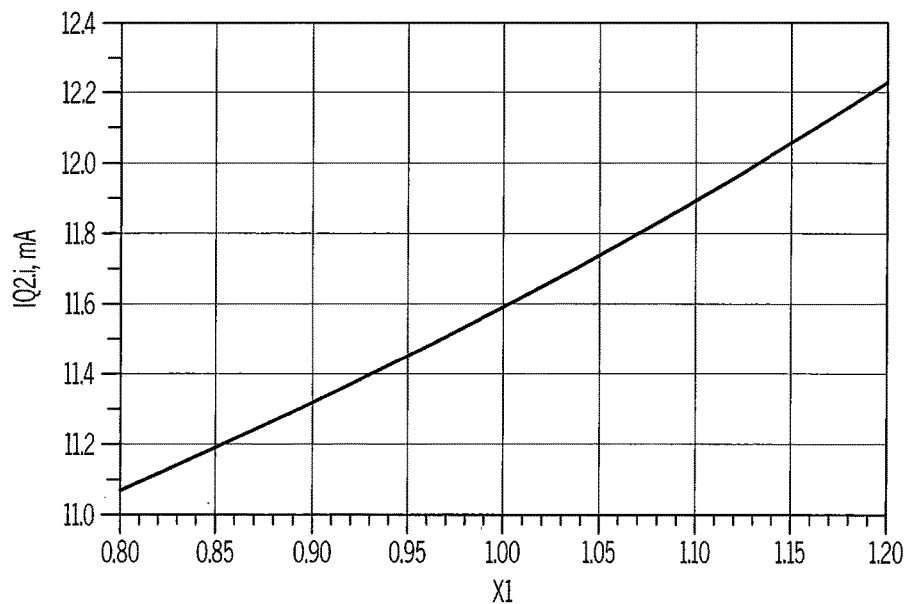
FIG. 17 graphically illustrates simulated bias current for an RF amplifier according to various embodiments described herein.

FIG. 17 illustrates simulation results for embodiments of FIG. 10, using the same HEMT parameters as was used in FIGS. 15, 16A and 16B. Again, note the large decrease in current variation as a function of threshold voltage variation.

Conventional RF amplifiers may apply a constant gate voltage on the RF device. However, a constant gate bias can cause the bias gate current to vary greatly with process variation, as was illustrated, for example, in FIG. 15.

Conventional RF amplifiers may also bias the RF device by grounding the gate of the RF device and placing a resistor and a bypass capacitor in the source of the RF device. This is often referred to as "self-biasing". Unfortunately, a self-bias resistor in the source of the RF device may limit the device to Class-A operation, and may not allow for operation in other amplifier classes that have better efficiency. The self-bias resistor may also reduce the voltage swing that is available to the RF device, which also may lower the efficiency of the amplifier.

In sharp contrast, a bias device 120, 120', 120" and an inverting circuit 130, 130' according to various embodiments described herein, can reduce the current variation as a function of threshold voltage variation, as was illustrated, for example, in FIGS. 16A and 16B. Moreover, various embodiments described herein need not restrict the class of operation of the RF amplifier, and may allow the RF amplifier to be operated more efficiently than in Class-A operation. The voltage swing available to the RF amplifier also may not be restricted.

Figure 18:
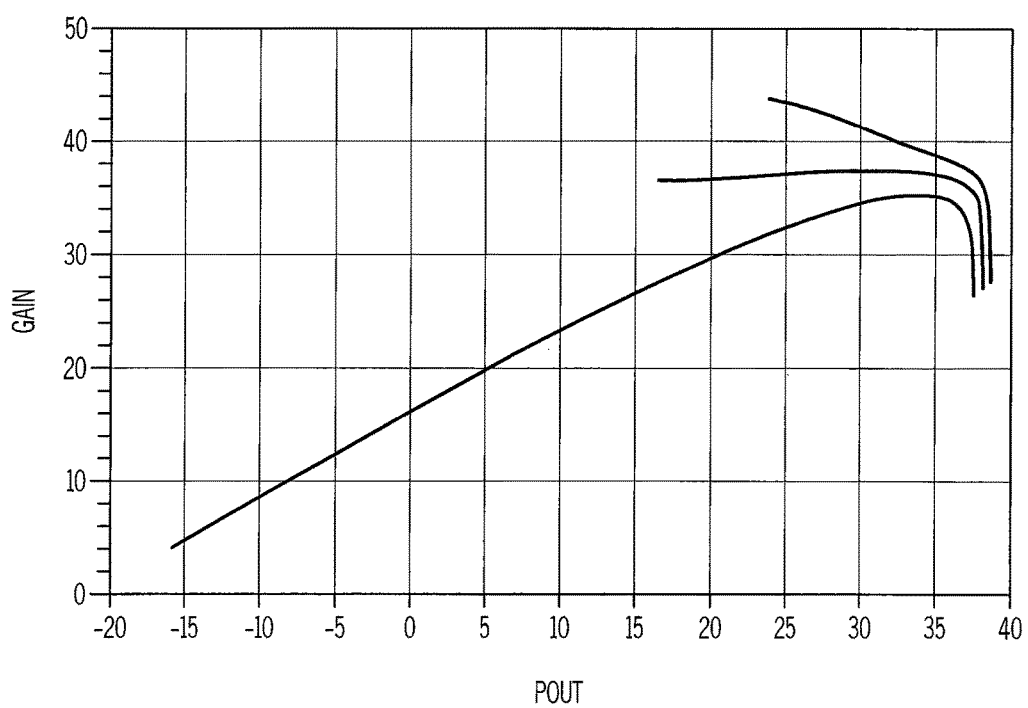
FIG. 18 illustrates simulated performance of a conventional three-stage linear amplifier using constant gate bias.
Figure 19:
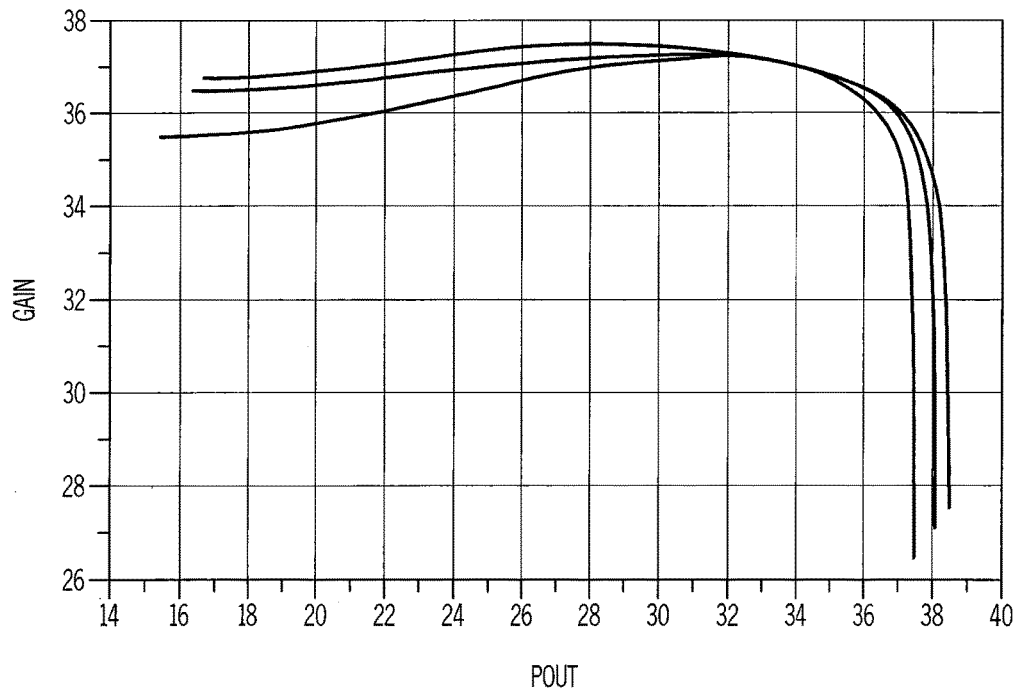
FIG. 19 graphically illustrates simulated performance of a three-stage linear amplifier according to various embodiments described herein.

FIGS. 18 and 19 compare simulated results of a three-stage linear amplifier design, without a bias circuit and inverting circuit according to various embodiments described herein (FIG. 18), and with a bias circuit and inverting circuit according to various embodiments described herein (FIG. 19). In FIGS. 18 and 19, "GAIN" is the ratio of the signal power at the output of the amplifier to the signal power at the input of the amplifier. For RF circuits, gain is traditionally shown in units of dB, which is a logarithmic scale. Moreover, POUT is the output power of the amplifier in units of dBm, where a dBm represents 1 milliwatt. A good linear amplifier will have gain that is relatively constant as a function of the output power (POUT) until the maximum output power is achieved.

FIG. 18 illustrates a simulation of a traditional constant gate voltage ($V_G$) used for a three-stage amplifier as the threshold voltage parameter is varied by +/−10%. As shown, the gain as a function of output power has a very large variation as a result of process variation and/or other factors, which reap in very poor linearity and performance.

In sharp contrast, FIG. 19 shows a simulation of the same amplifier used with a bias device and inverting circuit according to various embodiments described herein that can compensate for process variation and/or other effects as the normalized threshold voltage parameter is varied by +/−10%. As shown in FIG. 19, the gain as a function of output power is very flat right up to the maximum output power, even as the threshold voltage is varied by +/−10%. This shows extremely good linear performance as a function of output power and process variation.

Figure 20:
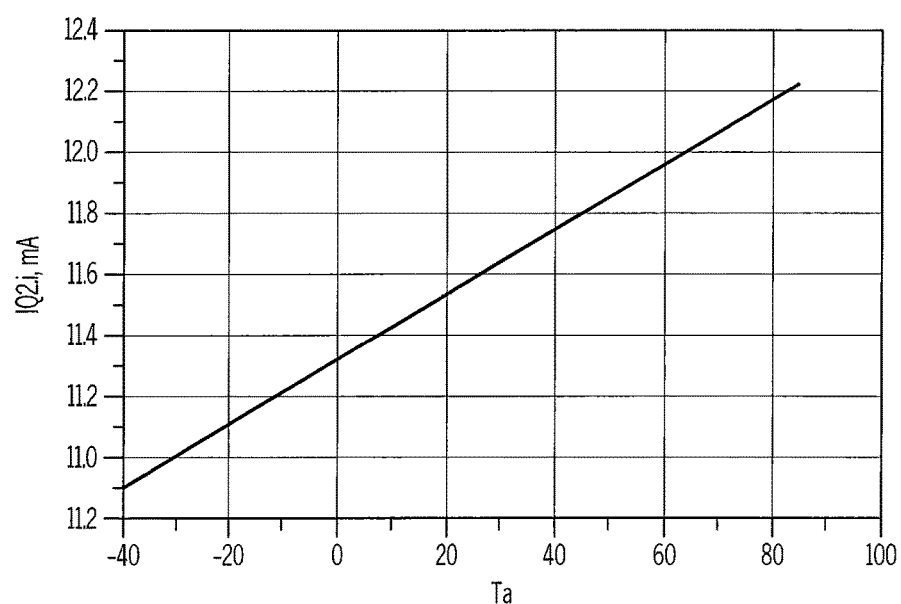
FIG. 20 graphically illustrates simulated current as a function of temperature for an RF amplifier according to various embodiments described herein.

Various embodiments have been described above in connection with providing process variation compensation. However, various embodiments described herein can also provide temperature compensation. For example, FIG. 20 shows simulation results for the circuit of FIG. 8 as a function of temperature (Ta).

Various embodiments described herein may be used for GaN MMIC amplifiers, to compensate for process and/or temperature variation. Various embodiments described herein may also be used with GaN discrete transistors by incorporating a bias device 120, 120', 120" on the same die as the depletion mode semiconductor device 110, 110', 110". This could make compensation for process variation easier for the end user.

Finally, various embodiments described herein may be used with any depletion mode device, including but not limited to GaAs MESFETs and GaAs pHEMTs, in addition to GaN HEMTs. Various embodiments described herein are also not constrained to linear amplifiers. They can be used with non-linear amplifiers, as well.

Various embodiments have been described herein with reference to the accompanying drawings. It will be appreciated, however, that the inventive concepts may, however, be embodied in many different forms and should not be construed as limited to the embodiments set forth above. Rather, these embodiments are provided so that this disclosure will be thorough and complete, and will fully convey the scope of the inventive concepts to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" "comprising," "includes", "including", "have" and/or "having" and variants thereof when used herein, specify the presence of stated features, steps, operations, elements, and/or components, but do not preclude the presence or addition of one or more other features, steps, operations, elements, components, and/or groups thereof.

It will be understood that when an element such as a layer, region or substrate is referred to as being "on" or extending "onto" another element (and variants thereof), it can be directly on or extend directly onto the other element or intervening elements may also be present. In contrast, when an element is referred to as being "directly on" or extending "directly onto" another element (and variants thereof), there are no intervening elements present. It will also be understood that when an element is referred to as being "connected" or "coupled" to another element (and variants thereof), it can be directly connected or coupled to the other element or intervening elements may be present. In contrast, when an element is referred to as being "directly connected" or "directly coupled" to another element (and variants thereof), there are no intervening elements present.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the inventive concepts and, although specific terms are employed, they are used in a generic and descriptive sense only and not for purposes of limitation, the scope of the inventive concepts being set forth in the following claims.

What is claimed is:

1. A Radio Frequency (RF) amplifier, comprising:
   a first depletion mode semiconductor device including a first gate that is connected to an RF input signal;
   a bias device that is configured to generate a bias voltage, the bias device comprising a second depletion mode semiconductor device comprising a second gate that is connected to a reference voltage; and
   an inverting circuit that is configured to generate an inverted bias voltage from the bias voltage and to apply the inverted bias voltage to the first gate.

2. The RF amplifier according to claim 1 wherein the first and second depletion mode semiconductor devices are configured to have substantially the same electrical and thermal characteristics.

3. The RF amplifier according to claim 1 wherein the first and second depletion mode semiconductor devices have substantially the same threshold voltage.

4. The RF amplifier according to claim 1 further comprising a current setting circuit that is connected to the second depletion mode semiconductor device.

5. The RF amplifier according to claim 1 wherein the inverting circuit comprises a differential amplifier having an inverting input that is connected to the bias device and an output that is connected to the first gate.

6. The RF amplifier according to claim 5 wherein the differential amplifier is a unity gain differential amplifier.

7. The RF amplifier according to claim 1 further comprising a third depletion mode semiconductor device including a third gate, wherein the inverted bias voltage is also applied to the third gate.

8. The RF amplifier according to claim 1 wherein the bias device is configured to mirror a current in the first depletion mode semiconductor device and to provide the bias voltage for the first depletion mode semiconductor device based on the current that is mirrored.

9. The RF amplifier according to claim 1 further comprising an input terminal that is configured to receive the RF input signal and is connected to the first gate.

10. The RF amplifier according to claim 1 wherein the first depletion mode semiconductor device comprises a High Electron Mobility Transistor (HEMT) and/or a Metal Semiconductor Field Effect Transistor (MESFET).

11. A Radio Frequency (RF) amplifier, comprising:
a first depletion mode semiconductor device including a first gate that is connected to an RF input signal;
a second depletion mode semiconductor device including a second gate that is connected to a reference voltage and that is configured to generate a bias voltage; and
an inverting circuit that is connected between the second depletion mode semiconductor device and the first gate and that is configured to generate an inverted bias voltage for the first depletion mode semiconductor device from the bias voltage.

12. The RF amplifier according to claim 11 wherein the first and second depletion mode semiconductor devices are included in a common semiconductor die.

13. The RF amplifier according to claim 11 wherein the second depletion mode semiconductor device includes a source and a drain, and wherein the RF amplifier further comprises a current setting circuit that is connected to the source.

14. The RF amplifier according to claim 13 wherein the inverting circuit comprises a differential amplifier having an inverting input that is connected between the source and the current setting circuit, and an output that is connected to the first gate to provide the inverted bias voltage to the first gate.

15. The RF amplifier according to claim 11 further comprising a resistor that connects the second gate to the reference voltage.

16. The RF amplifier according to claim 11 further comprising a third depletion mode semiconductor device including a third gate, wherein the inverting circuit is also connected to the third gate.

17. A method of operating a Radio Frequency (RF) amplifier that comprises a depletion mode semiconductor device including a gate, the method comprising:
generating a mirrored current of the depletion mode semiconductor device and a bias voltage corresponding to the mirrored current;
inverting the bias voltage to generate an inverted bias voltage; and
applying an RF input signal and the inverted bias voltage to the gate.

18. The RF amplifier according to claim 7 wherein the first depletion mode semiconductor device includes a drain that is connected to the third gate of the third depletion mode semiconductor device.

19. The RF amplifier according to claim 16 wherein the first depletion mode semiconductor device includes a drain that is connected to the third gate of the third depletion mode semiconductor device.

\* \* \* \* \*